(12) United States Patent
Peng et al.

(10) Patent No.: US 12,369,430 B2
(45) Date of Patent: Jul. 22, 2025

(54) BONDING METHOD FOR ELECTRONIC ELEMENT

(71) Applicant: Coretronic Corporation, Hsin-Chu (TW)

(72) Inventors: Yi-Hsing Peng, Hsin-Chu (TW); Ching-Tai Tseng, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 499 days.

(21) Appl. No.: 17/511,555

(22) Filed: Oct. 27, 2021

(65) Prior Publication Data

US 2022/0140181 A1    May 5, 2022

(30) Foreign Application Priority Data

Nov. 4, 2020 (CN) .......................... 202011214485.6

(51) Int. Cl.
   *H01L 33/00* (2010.01)
   *H01L 25/075* (2006.01)
   *H10H 20/01* (2025.01)

(52) U.S. Cl.
   CPC ......... *H10H 20/01* (2025.01); *H01L 25/0753* (2013.01); *H10H 20/0364* (2025.01)

(58) Field of Classification Search
   CPC . H01L 33/0095; H01L 24/81; H01L 25/0753; H01L 25/167; H01L 2224/16225;
   (Continued)

(56) References Cited

U.S. PATENT DOCUMENTS

| 5,329,423 A * | 7/1994 | Scholz ................... H05K 3/325 |
| | | 361/767 |
| 5,846,366 A * | 12/1998 | Jin .......................... H01L 24/11 |
| | | 257/E21.511 |

(Continued)

FOREIGN PATENT DOCUMENTS

| CN | 104885580 | 9/2015 |
| CN | 106997855 | 8/2017 |

(Continued)

OTHER PUBLICATIONS

"Office Action of China Counterpart Application", issued on Mar. 31, 2025, p. 1-p. 9.

*Primary Examiner* — Jay C Kim
(74) *Attorney, Agent, or Firm* — JCIPRNET (57) ABSTRACT

A bonding method for an electronic element includes attaching a solder film to a display substrate and covering multiple bonding pads, performing a heat treatment step so that a solder layer on the multiple bonding pads is transformed into multiple solder bumps, providing at least one electronic element and covering the solder bumps, and heating the solder bumps to electrically bond the at least one electronic element and the bonding pads. The display substrate includes multiple display panels, a first adhesive layer, and a glass cover. The first adhesive layer and the glass cover are disposed on one side of the display panel away from the bonding pads. During the bonding process of the at least one electronic element and the bonding pads, no pressure is applied between the at least one electronic element and the bonding pads.

9 Claims, 11 Drawing Sheets

(58) Field of Classification Search
CPC .... H01L 2224/812; H01L 2224/81801; H10H 20/01; H10H 20/0364; H10H 20/857; H10H 29/142

See application file for complete search history.

(56) References Cited

U.S. PATENT DOCUMENTS

| | | | | |
|---|---|---|---|---|
| 8,648,470 | B2* | 2/2014 | Lin | H01L 21/56 |
| | | | | 257/773 |
| 8,701,973 | B2* | 4/2014 | Kuramoto | H01L 21/6835 |
| | | | | 228/253 |
| 9,048,233 | B2* | 6/2015 | Wu | H01L 21/486 |
| 9,238,278 | B2* | 1/2016 | Sakurai | B23K 35/362 |
| 9,741,785 | B2* | 8/2017 | Bower | H10H 20/858 |
| 9,821,397 | B2* | 11/2017 | Kuramoto | H05K 3/3485 |
| 9,850,126 | B2* | 12/2017 | Pan | H01L 23/5384 |
| 9,893,041 | B2* | 2/2018 | Pokhriyal | H01L 33/0095 |
| 10,111,342 | B2* | 10/2018 | Tsuruta | H05K 3/321 |
| 10,177,123 | B2* | 1/2019 | Gardner | H01L 25/50 |
| 10,193,038 | B2* | 1/2019 | Farrens | H01L 33/62 |
| 10,224,308 | B2* | 3/2019 | Zou | H01L 33/0093 |
| 10,418,499 | B2* | 9/2019 | Schneider | H01L 31/035227 |
| 10,804,436 | B2* | 10/2020 | Danesh | H01L 33/46 |
| 10,872,842 | B2* | 12/2020 | Wan | H01L 23/36 |
| 11,069,837 | B2* | 7/2021 | Danesh | H01L 33/405 |
| 11,257,983 | B2* | 2/2022 | Schneider, Jr. | H01L 33/32 |
| 11,264,539 | B2* | 3/2022 | Batres | H01L 33/405 |
| 11,430,830 | B2* | 8/2022 | Danesh | H01L 33/06 |
| 11,605,754 | B2* | 3/2023 | Gallagher | H01L 24/81 |
| 11,631,650 | B2* | 4/2023 | Sakuma | B23K 3/0623 |
| | | | | 228/180.5 |
| 2018/0350707 | A1 | 12/2018 | Kishida | |
| 2019/0081200 | A1 | 3/2019 | Ting et al. | |
| 2019/0355780 | A1 | 11/2019 | Matsugai | |
| 2020/0274029 | A1* | 8/2020 | Schneider, Jr. | H01L 33/32 |

FOREIGN PATENT DOCUMENTS

| | | |
|---|---|---|
| CN | 111383934 | 7/2020 |
| TW | 202031833 | 9/2020 |
| WO | 2019154446 | 8/2019 |

* cited by examiner

BONDING METHOD FOR ELECTRONIC ELEMENT

CROSS-REFERENCE TO RELATED APPLICATION

This application claims the priority benefit of China application serial no. 202011214485.6, filed on Nov. 4, 2020. The entirety of the above-mentioned patent application is hereby incorporated by reference herein and made a part of this specification.

BACKGROUND

Technical Field

The disclosure relates to a fabrication technology, and more particularly, to a bonding method for an electronic element.

Description of Related Art

The diversified development of displays give rise to many life applications, such as electronic billboards, interactive interfaces for portable electronic devices, or wearable display devices. Either the current mainstream displays (e.g., liquid crystal displays or organic light-emitting diode displays) or the micro light-emitting diode displays in development need to work with integrated circuit (IC) chips to realize the display of the image screen. For example, currently, one of the most common technologies is that IC chips are disposed on a flexible circuit board and electrically bonded with a display substrate through an anisotropic conductive film (ACF).

During the bonding process, the ACF needs to undergo a hot pressing process to achieve the electrical conduction between the display substrate and the flexible circuit board. However, the control of pressure is very important for the conductivity of the ACF. For example, when the pressure is too small, the conductive particles of the ACF are not easily deformed and broken, resulting in poor conductivity; on the contrary, when the pressure is too large, the conductive particles of the ACF are severely deformed and completely attached between the display substrate and the flexible circuit board, resulting in a decrease in the reliability of electrical conduction. With the increasing application demand for spliced displays or flexible displays in recent years, the IC chips are bonded with a display substrate with a soft film layer (e.g., a flexible substrate or an adhesive layer), but since the pressure is absorbed by the soft film layer and therefore the conductive particles in the ACF is not squeezed and broken, resulting in poor conductivity, the bonding method for the IC chips and the display substrate with the soft film layer needs further research.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY

The disclosure provides a bonding method for an electronic element, contributing to a larger manufacturing process margin and a favorable bonding yield.

The bonding method for an electronic element in the disclosure includes steps: attaching a solder film to a display substrate and covering multiple bonding pads; performing a heat treatment step to transform the solder layer on the bonding pads into multiple solder bumps; providing at least one electronic element and covering the solder bumps; and heating the solder bumps to electrically bond the at least one electronic element and the bonding pads. The solder film includes the solder layer. The display substrate includes multiple display panels, a first adhesive layer, and a glass cover. The bonding pads are disposed on the display panels, and the first adhesive layer and the glass cover are disposed on one side of the display panels away from the bonding pads. The first adhesive layer is connected between the display panels and the glass cover, and the display panels are bonded in a splicing manner. During the bonding process of the at least one electronic element and the bonding pads, no pressure is applied between the at least one electronic element and the bonding pads.

Based on the above, in a bonding method for an electronic element according to an embodiment in the disclosure, after a heat treatment, multiple solder bumps corresponding to multiple bonding pads are formed on a solder layer attached to the multiple bonding pads of a display substrate, and the solder bumps are adapted to be heated to electrically bond the electronic element and the bonding pad. Since the display substrate is made up of multiple display panels adhered to a glass cover in a splicing manner and the bonding pads are respectively disposed on the display panels, the electrical bonding relationship between the electronic element and the bonding pad is implemented by heating, which increases the bonding yield of the electronic element on a soft film layer (e.g., the adhesive layer between the display panel and the glass cover). From another perspective, during the bonding process, since there is no need to apply pressure between the electronic element and the bonding pad, the damage to the electronic element caused by pressure is further prevented.

Other objectives, features and advantages of the disclosure will be further understood from the further technological features disclosed by the embodiments of the disclosure wherein there are shown and described preferred embodiments of this disclosure, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the disclosure may be practiced. In this regard, directional terminology, such as "top," "bottom," "front," "back," etc., is used with reference to the orientation of the Figure(s) being described. The components of the disclosure can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A "Component is directly "adjacent to" "B" component or one or more additional components are between "A" component and "B" component. Accordingly, the drawings and descriptions will be regarded as illustrative in nature and not as restrictive.

Figure 1:
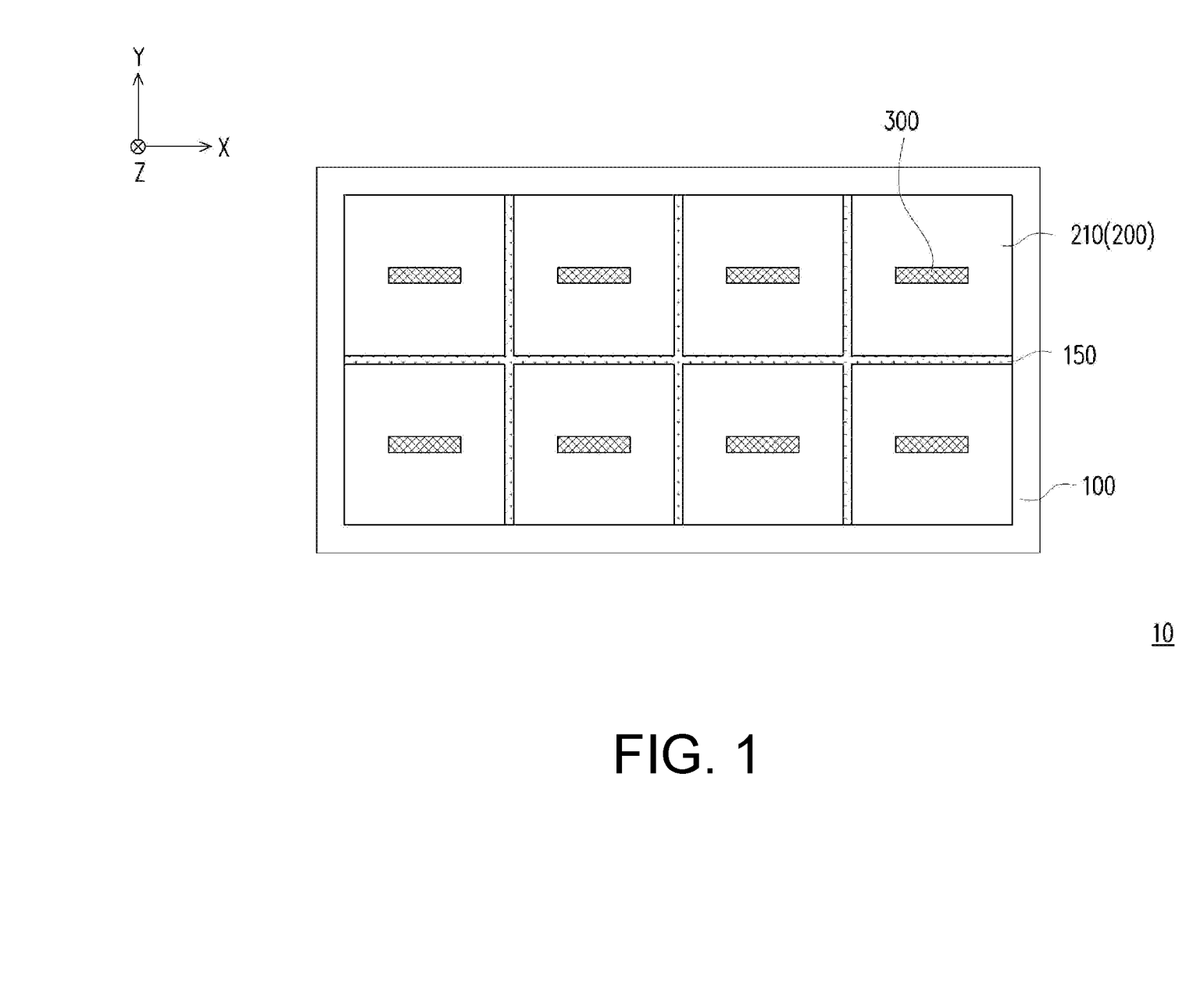
FIG. 1 is a schematic rear view of a display substrate adopting a bonding method for an electronic element according to an embodiment of the disclosure.
Figure 2:
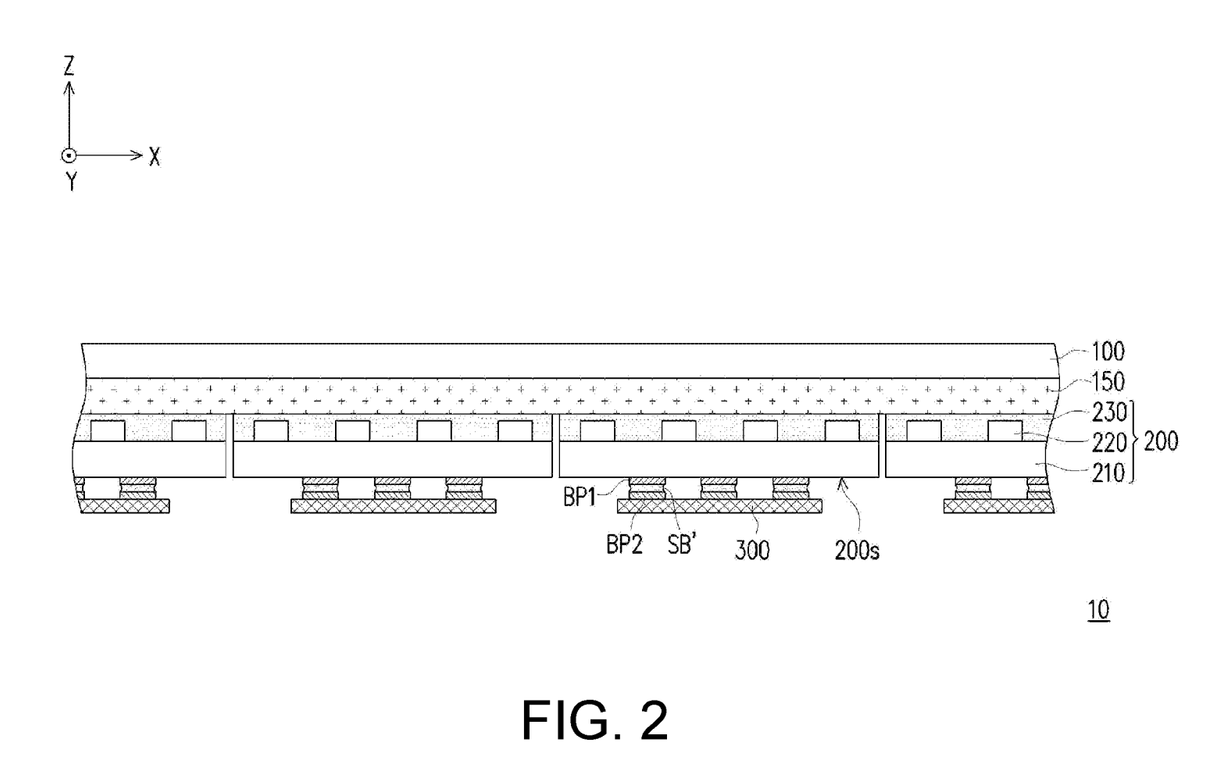
FIG. 2 is a schematic cross-sectional view of the display substrate of FIG. 1.

FIG. 1 is a schematic rear view of a display substrate adopting a bonding method for an electronic element according to an embodiment of the disclosure. FIG. 2 is a schematic cross-sectional view of the display substrate of FIG. 1. FIG. 3A to FIG. 3F are flowcharts illustrating a bonding method for an electronic element according to an embodiment of the disclosure. FIG. 4 is a flowchart illustrating a bonding method for an electronic element according to an embodiment of the disclosure. Referring to FIG. 1 and FIG. 2, a display substrate 10 includes a glass cover 100, a first adhesive layer 150, and multiple display panels 200. The first adhesive layer 150 is connected between the display panels 200 and the glass cover 100. More specifically, the display panels 200 are bonded and disposed on the glass cover 100 in a splicing manner. That is, the display substrate 10 is a spliced display, and one side of the glass cover 100 away from the display panel 200 is the display side. In the embodiment, the first adhesive layer 150 is a transparent adhesive layer, for example, optical clear adhesive (OCA), optical clear resin (OCR), or pressure sensitive adhesive (PSA).

For example, in the embodiment, the display panels 200 respectively may be arranged in multiple columns and multiple rows in a direction X and a direction Y, but the disclosure is not limited thereto. In other embodiments, the contour and the arrangement of the multiple display panels may also be adjusted according to actual design requirements. For example, the vertical projection contour of the display panel on the glass cover 100 is hexagonal, and the multiple display panels are spliced together in a honeycomb arrangement. Note that eight display panels 200 are illustrated as an example of the number of the display panels in the embodiment, which does not mean that the disclosure is limited thereto. In other embodiments, the number of display panels 200 may also be adjusted according to actual applications or design requirements.

Furthermore, the display panel 200 includes a circuit substrate 210, multiple light-emitting elements 220, and an encapsulation layer 230. The light-emitting elements 220 are disposed in an array on the circuit substrate 210 and electrically bonded with the circuit substrate 210. The encapsulation layer 230 covers the light-emitting elements 220 and part of the surface of the circuit substrate 210. Note that the light-emitting elements 220 in each of the display panels 200 are attached to the glass cover 100 in a direction (e.g., a direction Z) toward the display side. In the embodiment, for example, the light-emitting element 220 is a micro light-emitting diode (micro-LED), and its light-emitting color may be selected from red, yellow, green, or blue. That is, the display panel 200 may be a micro light-emitting diode (micro-LED) panel, but the disclosure is not limited thereto. In other embodiments, the display panel may also be a mini light-emitting diode (mini-LED) panel or an organic light-emitting diode (OLED) panel.

Note that in the embodiment, four light-emitting elements 220 are illustrated as an example of the number of the light-emitting elements 220 of the display panel 200, which does not mean that the disclosure is limited thereto. In other embodiments, the number of the light-emitting elements 220 of the display panel 200 may be adjusted according to actual application requirements. In the embodiment, the substrate material of the circuit substrate 210 may include glass, quartz, or other suitable hard materials, but the disclosure is not limited thereto. In other embodiments, the circuit substrate 210 may also be a flexible substrate, its materials include polyethylene terephthalate (PET), polyethylene naphthalate (PEN), polyethersulfone (PES), polymethyl methacrylate (PMMA), polycarbonate (PC), or other suitable high molecular polymers.

To implement the function of image display, the display substrate 10 further includes an electronic element 300, and multiple bonding pads BP1 are further disposed on a surface 200s of one side of the display panel 200 away from the glass cover 100. The first adhesive layer 150 and the glass cover 100 are disposed on one side of the display panel 200 away from the bonding pads BP1, and the light-emitting element 220 is also disposed on one side of the circuit substrate 210 away from the bonding pads BP1. The electronic elements 300 respectively are electrically bonded with the bonding pads BP1 of the display panel 200. In the embodiment, the electronic element 300 may be an integrated circuit (IC) chip, but the disclosure is not limited thereto. The bonding method for the electronic element 300 is illustrated below.

Figure 3A:
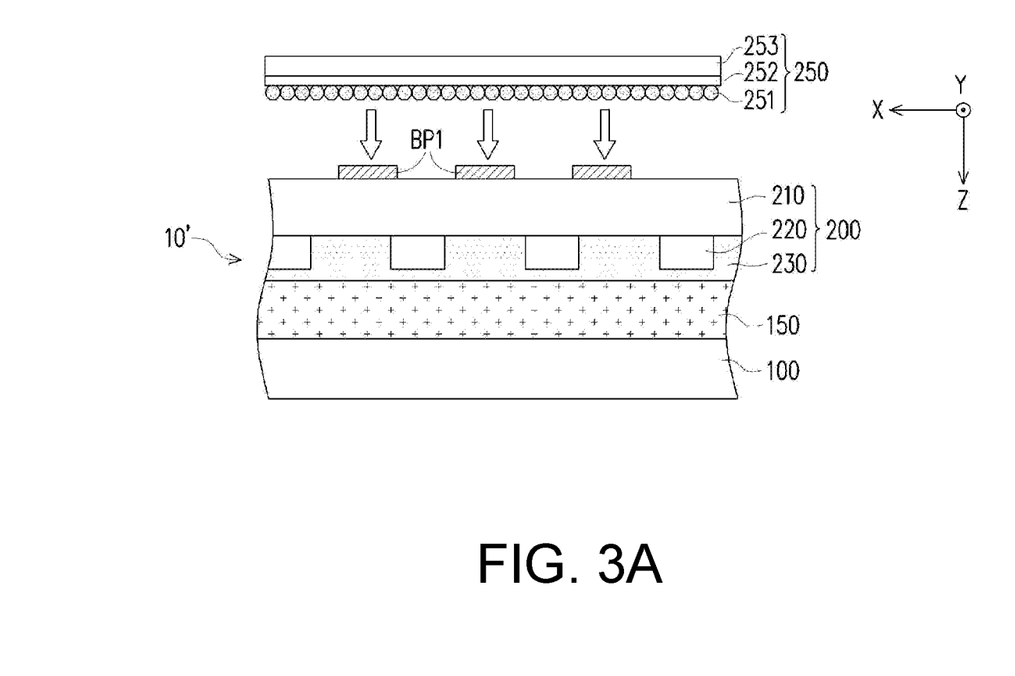
FIG. 3A to FIG. 3F are flowcharts illustrating a bonding method for an electronic element according to an embodiment of the disclosure.
Figure 4:
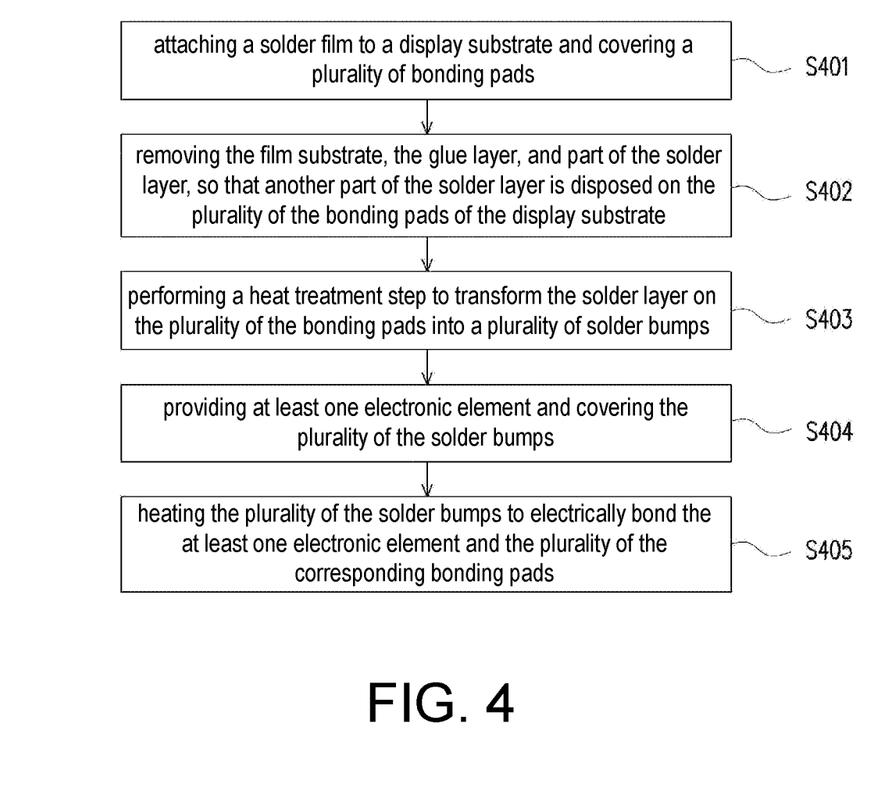
FIG. 4 is a flowchart illustrating a bonding method for an electronic element according to an embodiment of the disclosure.

Referring to FIG. 3A and FIG. 4, first, a solder film 250 is provided, and the solder film 250 is attached to a display substrate 10' and covers multiple bonding pads BP1 (step S401). In the embodiment, the solder film 250 includes a solder layer 251, a second adhesive layer 252, and a film substrate 253, and the second adhesive layer 252 is bonded with the solder layer 251 and the film substrate 253. For example, the solder film 250 is attached to the multiple bonding pads BP1 of the display substrate 10' by a heating process. In the embodiment, the step of heating process includes heating the solder layer 251 to a first temperature, and the first temperature is less than the melting point of the solder layer 251. In other embodiments, the method of attaching the solder film 250 to the display substrate 10' includes attaching, coating, screen printing, inkjet, and glue dispensing, etc., but the disclosure is not limited thereto.

Figure 3B:
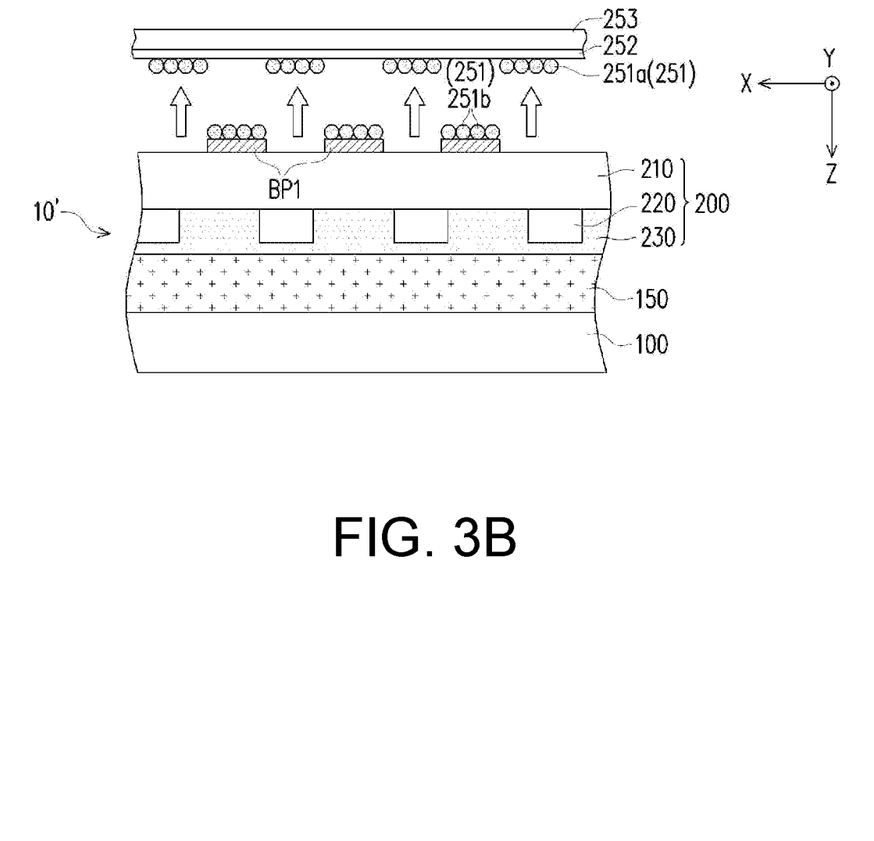

After bonding the solder film 250 and the multiple bonding pads BP1 is completed, as shown in FIG. 3B and FIG. 4, the film substrate 253, the second adhesive layer 252, and part of the solder layer 251a are removed from the display substrate 10' so that another part of the solder layer 251b is disposed on the bonding pads BP1 of the display substrate 10' (step S402). Specifically, when removing the film substrate 253, the second adhesive layer 252, and part of the solder layer 251a, the part of the solder layer 251 (i.e., the solder layer 251a) not in contact with the bonding pads BP1 is driven by the film substrate 253 to be away from the display substrate 10'. However, the disclosure is not limited thereto. According to other embodiments, the solder film may also be a combination of conductive particles and thermosetting adhesive, and the solder film is disposed on the display substrate by coating. That is, in other embodiments, the bonding method for the electronic element 300 may not include the step of removing the solder film (step S402).

Figure 3C:
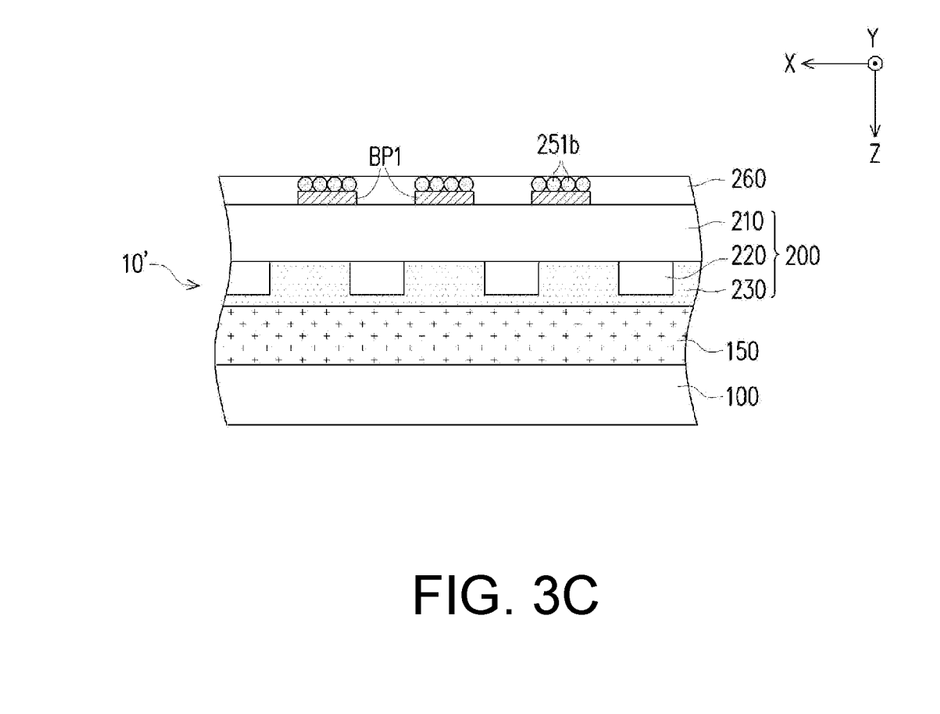
Figure 3D:
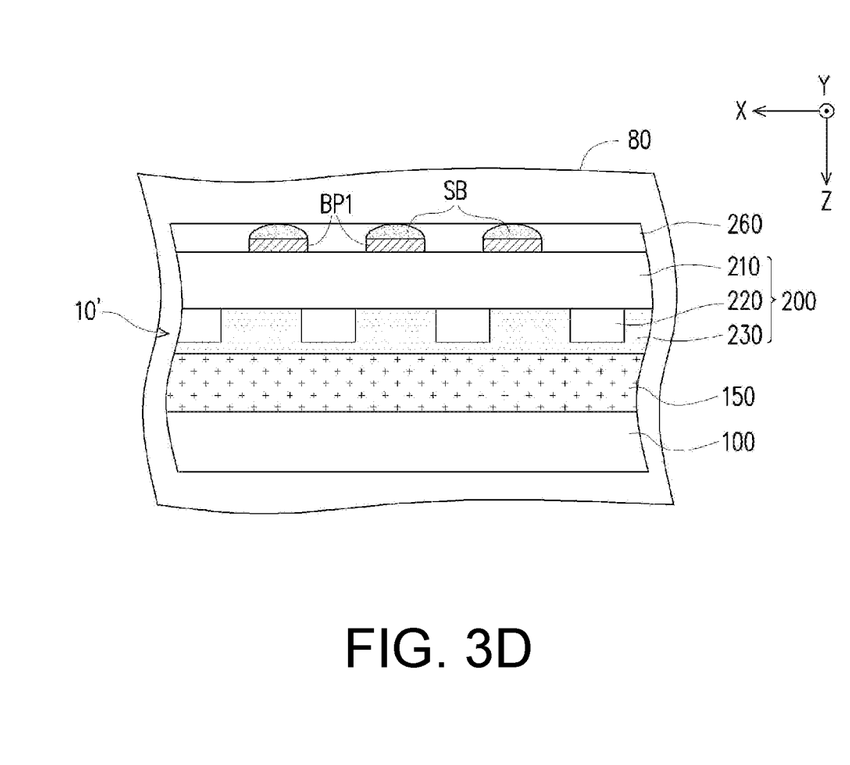

Referring to FIG. 3C, FIG. 3D, and FIG. 4, a heat treatment step is next performed to transform the solder layer 251b on the multiple bonding pads BP1 into multiple solder bumps SB (step S403). In the embodiment, the heat treatment step may optionally include: coating a soldering flux layer 260 on the display substrate 10', and the soldering flux layer 260 covers the solder layer 251b on the bonding pads BP1, but the disclosure is not limited thereto. For example, after the soldering flux layer 260 is formed, a heat treatment step of the display substrate 10' may be performed in a reflow furnace 80 so that the solder layer 251b on the bonding pad BP1 is melted and cohesive to an arc-shaped cross-sectional contour. After the heat treatment step is completed, the soldering flux layer 260 is removed from the display substrate 10', but the disclosure is not limited thereto. In other embodiments, the soldering flux layer 260 may gradually volatilize during the heat treatment process to simplify the manufacturing process of the bonding method for the electronic element.

Figure 3E:
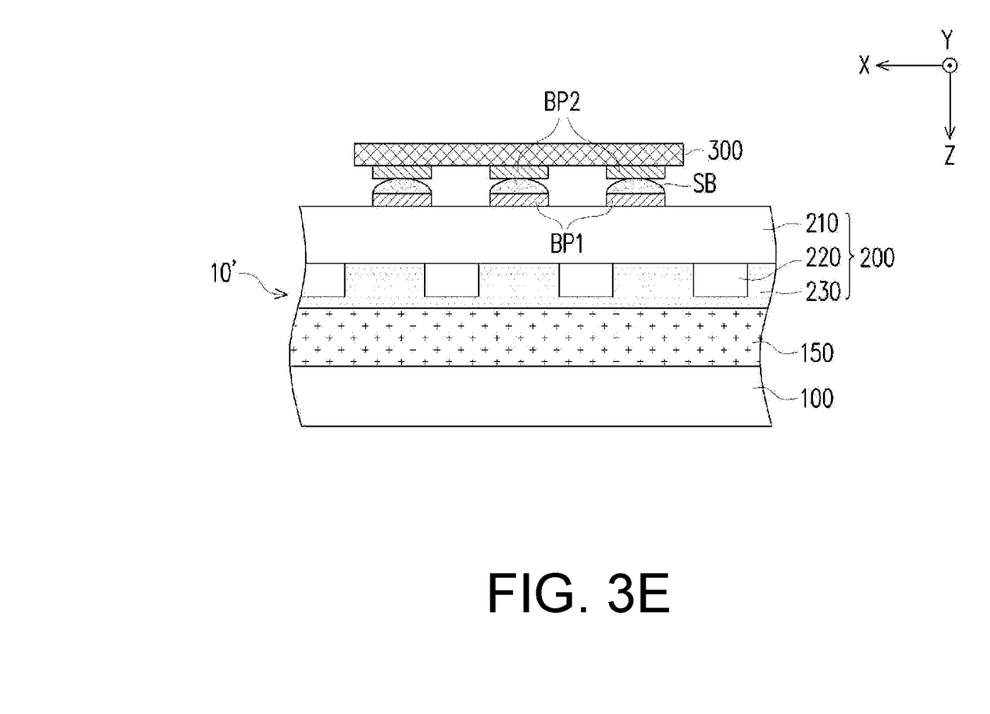

After the multiple solder bumps SB are formed, as shown in FIG. 3E and FIG. 4, at least one electronic element 300 is provided and covers the solder bumps SB (step S404). The electronic element 300 has multiple bonding pads BP2 corresponding to the multiple bonding pads BP1, and the solder bumps SB are disposed between the bonding pads BP1 and the bonding pads BP2. For example, when the electronic element 300 is transferred to the bonding pad BP1 of the display substrate 10', the electronic element 300 may be pre-fixed or positioned on the display substrate 10' by being applied predetermined pressure, but it is not limited thereto. Note that the predetermined pressure is only adapted for pre-fixing or positioning but not adapted for bonding the electronic element 300 with the solder bumps SB, and the bonding pads BP1 and BP2.

Figure 3F:
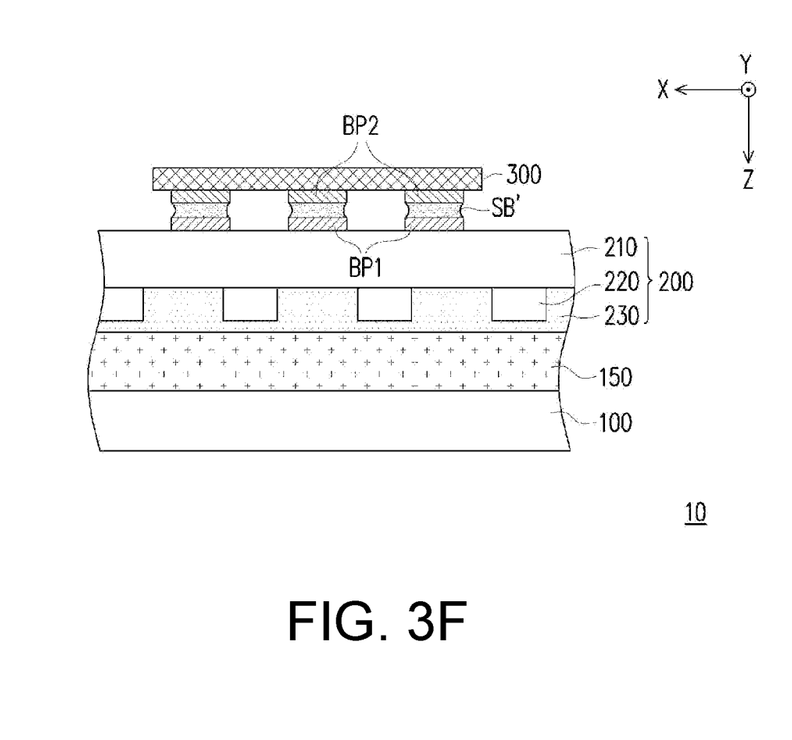

Referring to FIG. 3F as well, after the electronic element 300 is transferred, the multiple solder bumps SB are heated so that at least one electronic element 300 is electrically bonded with the corresponding multiple bonding pads BP1 (step S405). In the embodiment, the step of heating the solder bump SB includes heating the solder bump SB to a second temperature, and the second temperature is greater than the melting point of the solder bump SB (i.e., the melting point of the solder layer 251). When the solder bump SB is heated to a molten state, its cross-sectional contour becomes concave under the influence of the clamping of the bonding pad BP1 and the bonding pad BP2 and its own cohesive force, and the solder bump SB' is formed by re-temperature cooling.

Note that during the heating and bonding process of the electronic element 300 and the bonding pad BP1, there is no need to apply pressure between the electronic element 300 and the bonding pad BP1. Accordingly, damage to the electronic element 300 caused by pressure is prevented. From another perspective, since the multiple display panels 200 of the display substrate 10 are spliced on the glass cover 100 by the first adhesive layer 150, the electrical bonding relationship between the electronic element 300 and the bonding pad BP1 is implemented by heating, and the bonding yield of the electronic element 300 on the soft film layer (e.g., the first adhesive layer 150 or the flexible substrate) is improved.

More embodiments are included to provide a further understanding of the disclosure. Elements with the same reference numerals represent the same or similar parts, and descriptions of same technical content are omitted. Refer to the foregoing embodiments for the omitted descriptions, which are not iterated.

Figure 5:
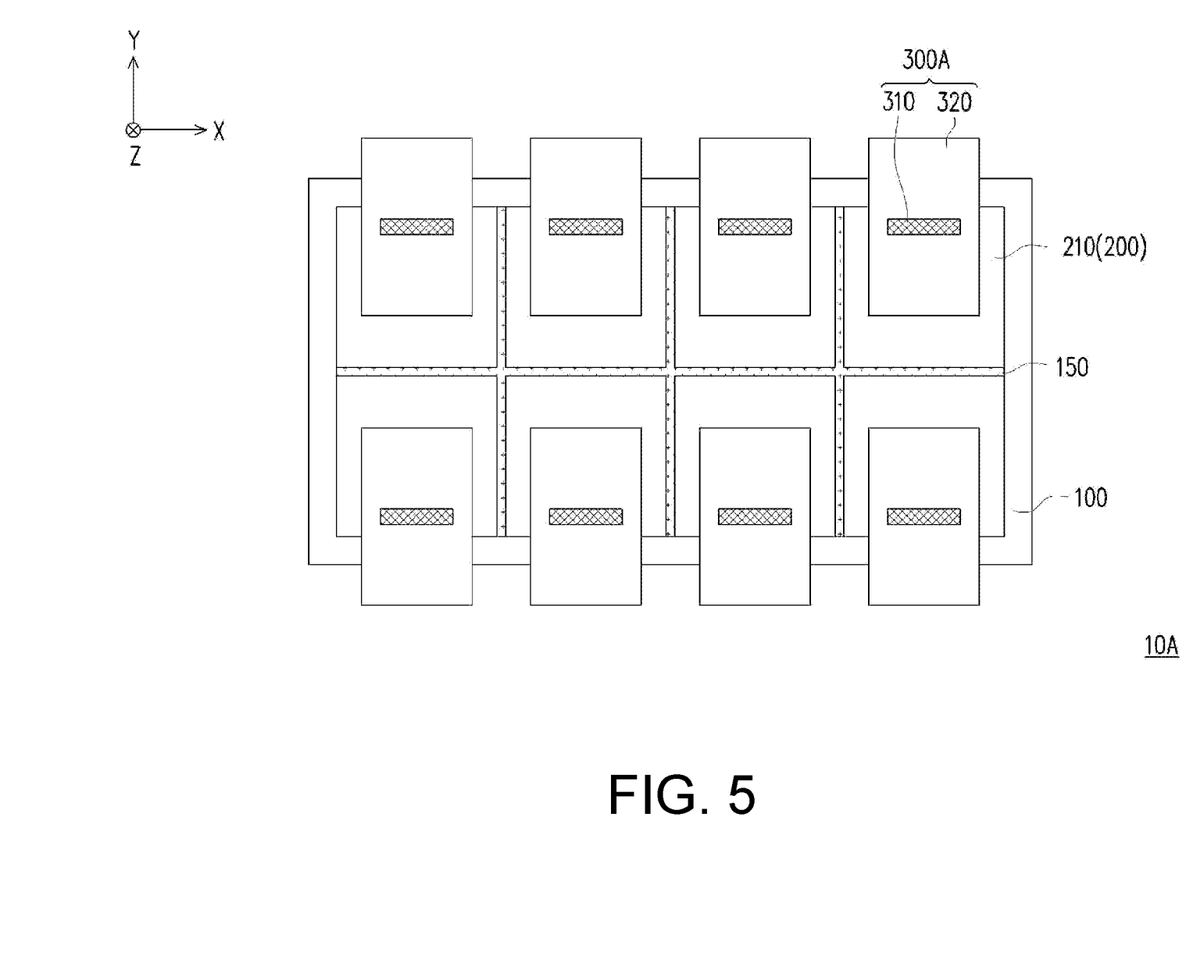
FIG. 5 is a schematic rear view of a display substrate adopting a bonding method for an electronic element according to another embodiment of the disclosure.

FIG. 5 is a schematic rear view of a display substrate adopting a bonding method for an electronic element according to another embodiment of the disclosure. Referring to FIG. 5, the difference between a display substrate 10A of the embodiment and the display substrate 10 of FIG. 1 is that the types of electronic elements are different. In the embodiment, an electronic element 300A of the display substrate 10A is a driving circuit board. For example, the electronic element 300A includes an integrated circuit chip 310 and a flexible circuit board 320, and the integrated circuit chip 310 is disposed on the flexible circuit board 320. In other words, the electronic element 300A, for example, is a chip-on-flex (COF) board. Multiple circuit pins (not shown) are disposed on a side surface of the flexible circuit board 320 away from the integrated circuit chip 310, and the electronic element 300A is electrically bonded with multiple bonding pads (not shown) on the display substrate 10A through the circuit pins.

In the embodiment, the bonding method for the circuit pins of the electronic element 300A and the bonding pad on the display substrate 10A is similar to the bonding method for the electronic element 300 and the bonding pad BP1 of the aforementioned embodiment. Refer to the relevant paragraphs of the aforementioned embodiment for detailed description, which is not iterated.

Figure 6:
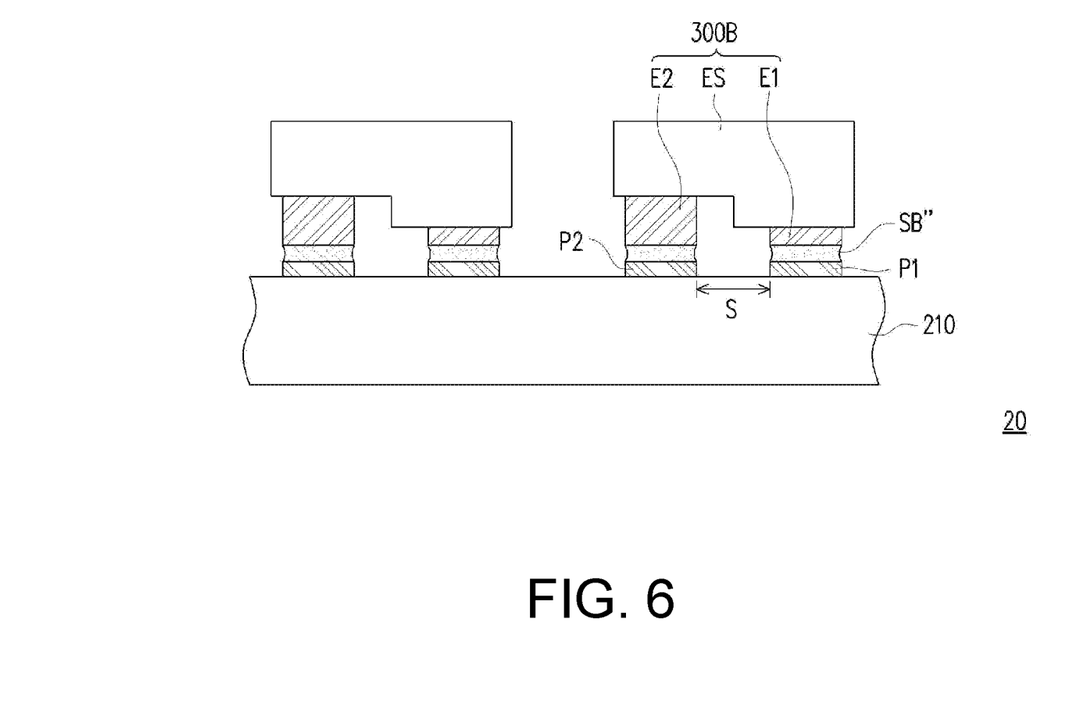
FIG. 6 is a schematic cross-sectional view of a display substrate adopting a bonding method for an electronic element according to yet another embodiment of the disclosure.

FIG. 6 is a schematic cross-sectional view of a display substrate adopting a bonding method for an electronic element according to yet another embodiment of the disclosure. Referring to FIG. 6, the difference between a display substrate 20 of the embodiment and the display substrate 10 of FIG. 2 is that the types of electronic elements are different. Specifically, an electronic element 300B of the display substrate 20 is an optoelectronic element. In the embodiment, the electronic element 300B has an epitaxial structure ES, a first electrode E1, and a second electrode E2; and the first electrode E1 and the second electrode E2 are disposed on the same side of the epitaxial structure ES. More specifically, for example, the electronic element 300B is a flip-chip type light-emitting diode.

For example, multiple bonding pads (e.g., bonding pads P1 and P2) are disposed on the circuit substrate 210 of the display substrate 20; and the first electrode E1 and the second electrode E2 of the electronic element 300B respectively are electrically bonded with the bonding pads P1 and P2 of the circuit board 210 through the solder bumps SB". In the embodiment, the bonding method for the electronic element 300B and the bonding pad of the display substrate 20 is similar to the bonding method for the electronic element 300 and the bonding pad BP1 of the aforementioned embodiment. Refer to the relevant paragraphs of the aforementioned embodiment for detailed description, which is not iterated.

In the embodiment, a distance S exists between two adjacent bonding pads P1 and P2 on the circuit substrate 210 in the arrangement direction of the bonding pads, and the distance S is less than 30 microns. Since the distance between two adjacent solder bumps SB" also needs to correspond to the distance S between two adjacent bonding pads P1 and P2, the distance between two adjacent solder bumps SB" is also less than 30 microns. In other words, the electronic element 300B of the embodiment may be a micro light-emitting diode. However, the disclosure is not limited thereto. In other embodiments, the distance between any adjacent two of the multiple bonding pads adapted to bond the integrated circuit chip or the chip-on-flex board may range from 25 microns to 50 microns. In other words, the bonding method for the electronic element in the disclosure is also adapted for electrically bonding precision circuits.

Based on the above, in a bonding method for an electronic element according to an embodiment in the disclosure, after a heat treatment, multiple solder bumps corresponding to multiple bonding pads are formed on a solder layer attached to the multiple bonding pads of a display substrate, and the solder bumps are adapted to be heated to electrically bond the electronic element and the bonding pad. Since the display substrate is made up of multiple display panels adhered to a glass cover in a splicing manner and the bonding pads are respectively disposed on the display panels, the electrical bonding relationship between the electronic element and the bonding pad is implemented by heating, which increases the bonding yield of the electronic element on a soft film layer (e.g., the adhesive layer between the display panel and the glass cover). From another perspective, during the bonding process, since there is no need to apply pressure between the electronic element and the bonding pad, the damage to the electronic element caused by pressure is further prevented.

The foregoing description of the preferred of the disclosure has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the disclosure" or the like does not necessarily limit the claim scope to a specific embodiment, and the reference to particularly preferred exemplary embodiments of the disclosure does not imply a limitation on the invention, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the disclosure as defined by the following claims. Moreover, no element and component in the present disclosure is intended to be dedicated to the public regardless of whether the element or component is explicitly recited in the following claims.

What is claimed is:

1. A bonding method for at least one electronic element, comprising:

attaching a solder film to a plurality of bonding pads of a display substrate by heating the solder film, wherein the display substrate further comprises a plurality of display panels, a first adhesive layer, and a glass cover, the plurality of bonding pads are disposed on the plurality of display panels, the first adhesive layer and the glass cover are disposed on one side of the plurality of display panels away from the plurality of bonding pads, the first adhesive layer is connected between the plurality of display panels and the glass cover, and the plurality of display panels are bonded to the first adhesive layer in a splicing manner, the solder film comprises a solder layer, a second adhesive layer and a film substrate, the second adhesive layer is connected between the solder layer and the film substrate, parts of the solder layer are connected with the plurality of bonding pads after heating the solder film, wherein each of the plurality of display panels comprises a circuit substrate, a plurality of light-emitting elements and an encapsulation layer, the plurality of light-emitting elements are disposed on one side of the circuit substrate away from the plurality of bonding pads, the encapsulation layer covers the plurality of light-emitting elements and parts of a surface of the circuit substrate;

removing the film substrate, the second adhesive layer, and another part of the solder layer from the plurality of bonding pads of the display substrate, wherein the parts of the solder layer connected with the plurality of bonding pads are kept on the plurality of bonding pads of the display substrate;

performing a heat treatment step to transform the parts of the solder layer connected with the plurality of bonding pads into a plurality of solder bumps;

providing the at least one electronic element to contact with the plurality of solder bumps; and heating the plurality of solder bumps to electrically bond the at least one electronic element and the plurality of bonding pads.

2. The bonding method for the at least one electronic element according to claim 1, wherein the step of heating the solder film comprises heating the solder layer to a first temperature, and the first temperature is less than a melting point of the solder layer; the step of heating the plurality of solder bumps comprises heating the plurality of solder bumps to a second temperature, and the second temperature is greater than a melting point of the solder layer.

3. The bonding method for the at least one electronic element according to claim 1, wherein the heat treatment step comprises:

coating a soldering flux layer on the display substrate, wherein the soldering flux layer covers the parts of the solder layer connected with the plurality of bonding pads.

4. The bonding method for the at least one electronic element according to claim 3, further comprising:

removing the soldering flux layer from the display substrate after the heat treatment step is completed.

5. The bonding method for the at least one electronic element according to claim 1, wherein in the step of removing the film substrate, the second adhesive layer, and the another part of the solder layer from the plurality of bonding pads of the display substrate, the another part of the solder layer not in contact with the plurality of bonding pads is driven by the film substrate to be away from the display substrate.

6. The bonding method for the at least one electronic element according to claim 1, wherein the at least one electronic element is a driving circuit board.

7. The bonding method for the at least one electronic element according to claim 1, wherein the at least one electronic element is an integrated circuit chip, a chip-on-flex board, or an optoelectronic element.

8. The bonding method for the at least one electronic element according to claim 1, wherein the plurality of display panels are a plurality of micro light-emitting diode panels.

9. The bonding method for the at least one electronic element according to claim 1, wherein a distance exists between any adjacent two of the plurality of bonding pads in the arrangement direction of the plurality of bonding pads, and the distance is less than 30 microns.

* * * * *